United States Patent
Suzuki et al.

(10) Patent No.: US 8,865,498 B2
(45) Date of Patent: Oct. 21, 2014

(54) METHOD FOR MANUFACTURING THREE-DIMENSIONALLY SHAPED COMB-TOOTH ELECTRET ELECTRODE

(71) Applicant: AOI Electronics Co., Ltd., Takamatsu (JP)

(72) Inventors: Masato Suzuki, Takamatsu (JP); Hiroki Hayashi, Takamatsu (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 0 days.

(21) Appl. No.: 13/968,817

(22) Filed: Aug. 16, 2013

(65) Prior Publication Data

US 2014/0065751 A1 Mar. 6, 2014

(30) Foreign Application Priority Data

Aug. 30, 2012 (JP) ................. 2012-190349

(51) Int. Cl.
*H01L 21/00* (2006.01)
*B81C 1/00* (2006.01)
*H01G 7/02* (2006.01)

(52) U.S. Cl.
CPC ............ *B81C 1/00436* (2013.01); *H01G 7/025* (2013.01)
USPC .......................... 438/50; 361/679.01; 330/307

(58) Field of Classification Search
CPC ....................................................... H01G 7/02
USPC .......................... 438/50; 361/679.01; 330/307
See application file for complete search history.

(56) References Cited

U.S. PATENT DOCUMENTS

2012/0169179 A1   7/2012   Masaki et al.
2013/0229087 A1   9/2013   Hayashi et al.

FOREIGN PATENT DOCUMENTS

| JP | 2008-110436 A | 5/2008 |
| JP | 2010-11547 A | 1/2010 |
| JP | 2010-68643 A | 3/2010 |
| JP | 2010-136598 A | 6/2010 |
| JP | 2011-72070 A | 4/2011 |
| JP | 2012-36247 A | 2/2012 |

*Primary Examiner* — Mark A Laurenzi
(74) *Attorney, Agent, or Firm* — Crowell & Moring LLP

(57) ABSTRACT

A method for manufacturing a three-dimensionally shaped comb-tooth electret electrode, provided with positive ions, includes: forming a three-dimensional movable comb-tooth electrode and a three-dimensional fixed comb-tooth electrode from an Si substrate; contacting a vapor including ions thereto, and forming an oxide layer including ions upon surfaces of the comb-tooth electrodes with heat applied thereto; and applying a voltage between the movable electrode and the fixed electrode with heat applied thereto, and thereby causing the ions included in the oxide layer to shift to a surface of the oxide layer; wherein, the voltage between the movable electrode and the fixed electrode is changed, so that the operation of each of the comb-teeth of the movable electrode being alternatingly pulled in against two opposed comb-teeth of the fixed electrode is repeated, and the pulling in voltage and the pulled-in state release voltage are gradually increased.

5 Claims, 11 Drawing Sheets

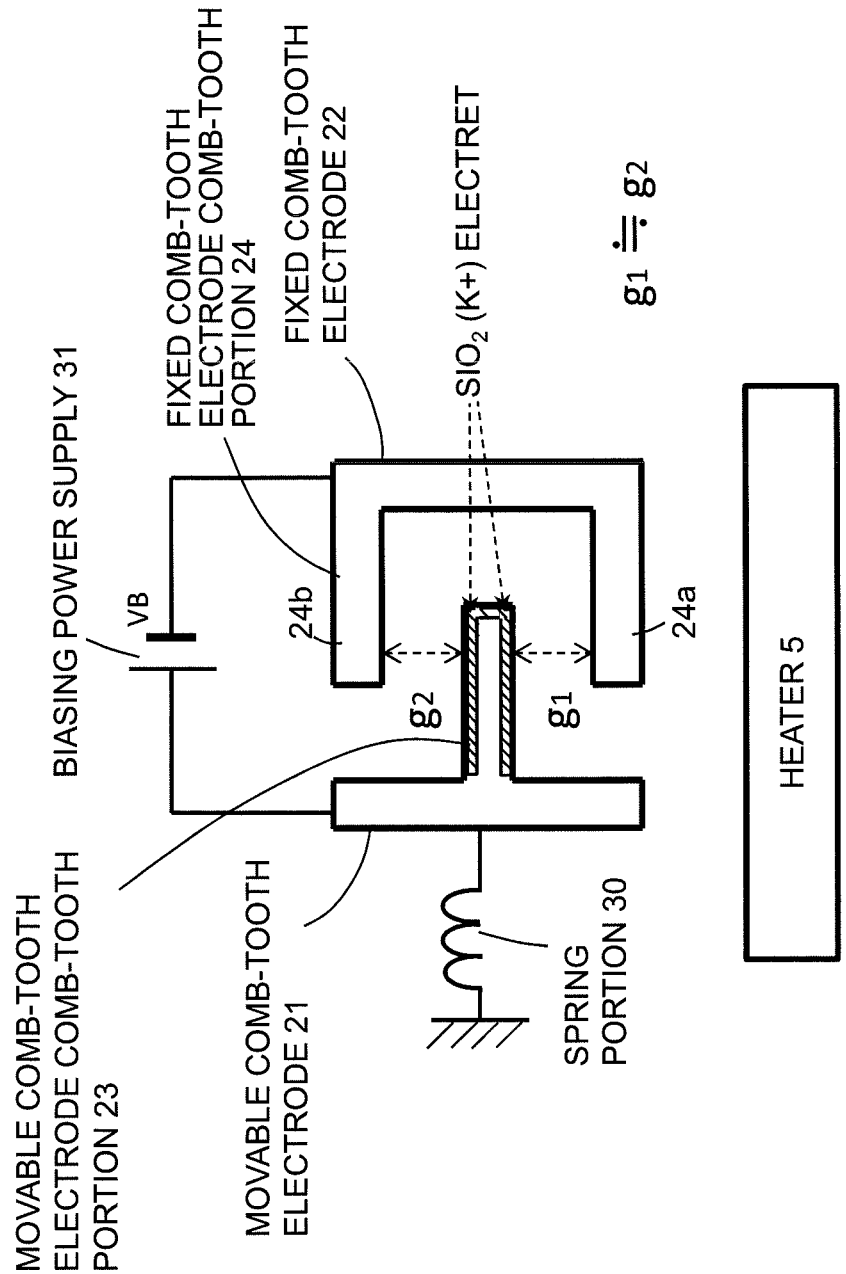

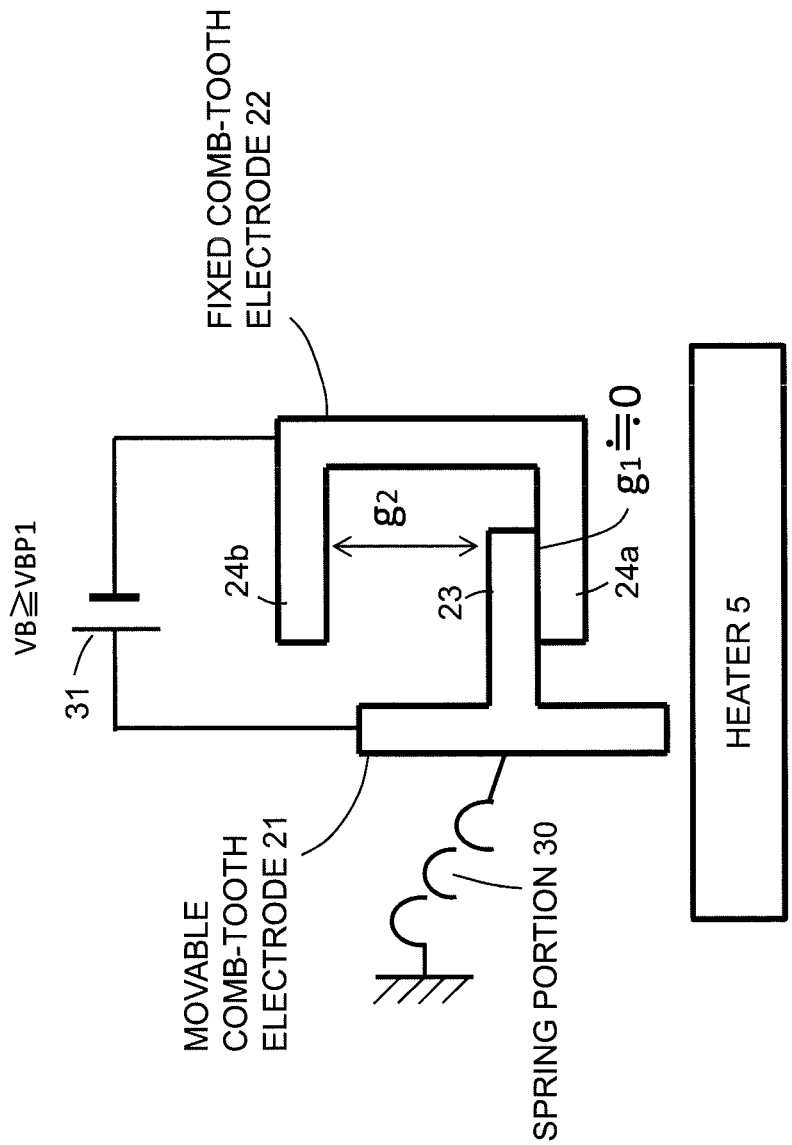

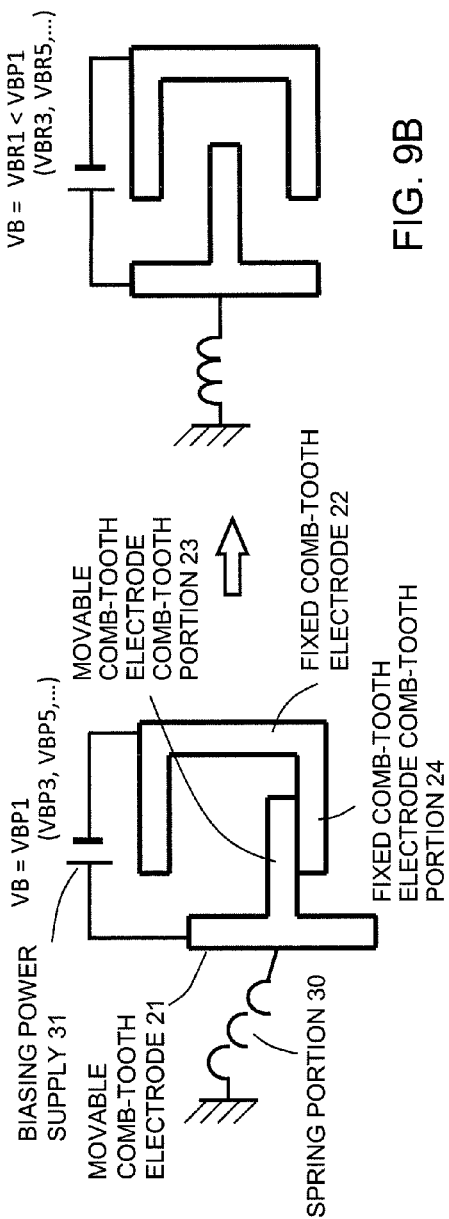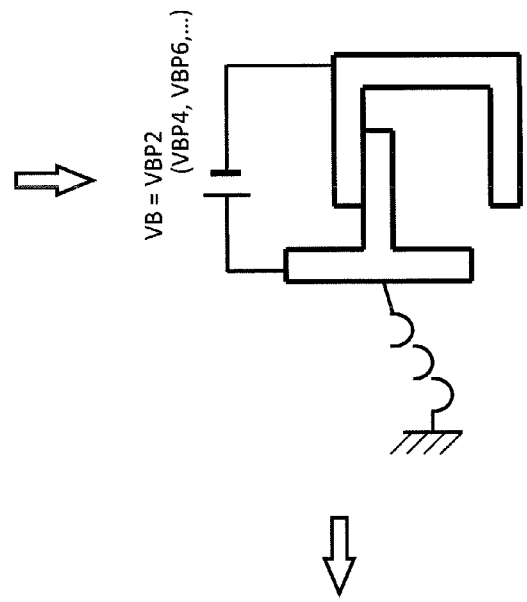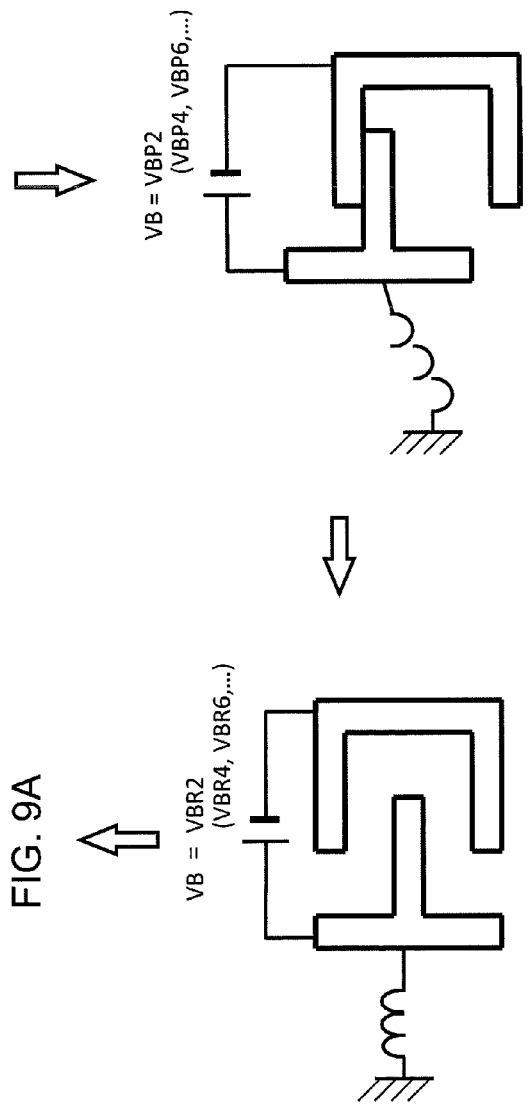

FIG.11

BENEFITS OF ABT TREATMENT IN A HYDROGEN ATMOSPHERE

| HYDROGEN ATMOSPHERE | NO | YES |
|---|---|---|
| VACUUM CHAMBER PRESSURE | 2kPa | 6kPa |
| FINAL APPLIED VOLTAGE VB | 200V | 200V |
| ELECTRET VOLTAGE VE | 95V | 200V |

METHOD FOR MANUFACTURING THREE-DIMENSIONALLY SHAPED COMB-TOOTH ELECTRET ELECTRODE

INCORPORATION BY REFERENCE

The disclosure of the following priority application is herein incorporated by reference: Japanese Patent Application No. 2012-190349, filed Aug. 30, 2012.

BACKGROUND OF THE INVENTION

1. Field of the Invention

The present invention relates to a method for manufacturing a three-dimensionally shaped comb-tooth electret electrode.

2. Description of Related Art

An electret that is formed to have mutually opposing planar comb-tooth electrodes is per se known as an electricity generation element that converts vibrational energy into electrical energy. This type of electricity generation element has a construction in which, for example, two comb-tooth structures are provided in two mutually opposing rectangular regions (for example, refer to Japanese Laid-Open Patent Publication 2010-136598) or circular regions (for example, refer to Japanese Laid-Open Patent Publication 2011-072070).

With an electricity generation element employing an electret in which planar comb-tooth electrodes of this type are formed, in order to increase the capacity for electricity generation, it is necessary to make the area great, and accordingly it has been difficult to manufacture a compact electricity generation element whose output is high.

In recent years, by employing the MEMS technique to manufacture the comb-tooth electrodes in a three-dimensional construction, a compact electricity generation element has been developed in which the electrostatic capacity between the opposing electrodes has been increased. For example, mutually opposed three-dimensional comb-tooth electrodes of this type are used in the electricity generation element disclosed in Japanese Laid-Open Patent Publication 2010-011547, and an electret that is provided in the vicinity of the comb-tooth electrodes is used as a means of applying voltage between the electrodes.

Generally, the manufacture of an electret is performed by injecting electric charges into an insulation layer with a corona electrical discharge. However since, with an electret that has been manufactured by this method, there are the problems that the electric charge density in the insulation layer is low, and also that the electric charge level may decrease due to long-term use, accordingly a construction for an electret is desired that can provide a higher electric charge density and also a longer life.

In Japanese Laid-Open Patent Publication 2010-068643, a construction is disclosed for manufacturing an electret having planar comb-tooth electrodes, in which so-called BT treatment (Bias-Temperature treatment) is performed by applying a voltage of around 500 V to 1000 V to an alkali glass while heating it to a temperature that is less than the glass transition point, so that alkali ions within this alkali glass are shifted and a region that is depleted in alkali ions is created.

SUMMARY OF THE INVENTION

With prior art methods and structures for manufacturing electrets, it has not been possible to maintain a high density of electric charge over the long term. Moreover, it has not been possible to manufacture an electret in which three-dimensional mutually opposed comb-tooth electrodes bearing a high density of electric charge.

According to the 1st aspect of the present invention, a method for manufacturing a three-dimensionally shaped comb-tooth electret electrode, provided with an electret in which ions having positive electric charge are held, comprises: a first step of forming a three-dimensionally shaped movable comb-tooth electrode and a three-dimensionally shaped fixed comb-tooth electrode that are made from an Si substrate by a semiconductor process; a second step of, in a state in which heat is being applied to the three-dimensionally shaped movable comb-tooth electrode and to the three-dimensionally shaped fixed comb-tooth electrode, contacting a vapor including the ions thereto, and forming an oxide layer including the ions upon surfaces of the three-dimensionally shaped movable comb-tooth electrode and of the three-dimensionally shaped fixed comb-tooth electrode; and a third step of, along with applying a voltage between the three-dimensionally shaped movable comb-tooth electrode and the three-dimensionally shaped fixed comb-tooth electrode so as to make these electrodes be either a positive side and a negative side respectively or a negative side and a positive side respectively, also applying heat to the three-dimensionally shaped movable comb-tooth electrode and to the three-dimensionally shaped fixed comb-tooth electrode, and causing the ions included in the oxide layer on the three-dimensionally shaped movable comb-tooth electrode or the three-dimensionally shaped fixed comb-tooth electrode to shift to a surface of the oxide layer; wherein the third step includes: a voltage elevation step of raising the voltage between the three-dimensionally shaped movable comb-tooth electrode and the three-dimensionally shaped fixed comb-tooth electrode up to a pulling in voltage at which the three-dimensionally shaped movable comb-tooth electrode is pulled against the three-dimensionally shaped fixed comb-tooth electrode; a voltage maintenance step of maintaining the pulling in voltage for a predetermined time interval; and a voltage reduction step of reducing the voltage to a pulled-in state release voltage at which the three-dimensionally shaped movable comb-tooth electrode, that was pulled against the three-dimensionally shaped fixed comb-tooth electrode, is pulled away therefrom; and the voltage elevation step, the voltage maintenance step, and the voltage reduction step are repeatedly performed while the values of the pulling in voltage and of the pulled-in state release voltage are changed so as to be gradually increased, so that the operation of each of the comb-teeth of the three-dimensionally shaped comb-tooth electrode being alternatingly pulled in against two opposed comb-teeth of the three-dimensionally shaped fixed comb-tooth electrode is repeated.

According to the 2nd aspect of the present invention, in a method for manufacturing a three-dimensionally shaped comb-tooth electret electrode according to the 1st aspect, it is preferred that the third step is performed in a hydrogen atmosphere.

According to the 3rd aspect of the present invention, a method for manufacturing a three-dimensionally shaped comb-tooth electret electrode according to the 1st or 2nd aspect, further comprises a fourth step, performed after the third step, in which a hydrophobic membrane is formed on the surface of the oxide layer by, in an atmosphere of nitrogen, contacting water vapor including a chemical substance for forming a hydrophobic chemically adsorbed monomolecular layer against the surface of the oxide layer; and wherein the third step and the fourth step are performed continuously within one common vessel.

According to the 4th aspect of the present invention, in a method for manufacturing a three-dimensionally shaped comb-tooth electret electrode according to any one of 1st through 3rd aspects, it is preferred that the ions are alkali ions.

According to the 5th aspect of the present invention, in a method for manufacturing a three-dimensionally shaped comb-tooth electret electrode according to the 4th aspect, it is preferred that the ions are K+ ions.

BRIEF DESCRIPTION OF THE DRAWINGS

FIG. 1A shows an Si substrate before commencement of this manufacturing process for the electret electrode;

FIG. 1B shows a state A of the Si substrate in which an $SiO_2$ layer containing K+ ions has been formed thereupon;

FIG. 1C shows a process of, while applying heat to the Si substrate in the state A, shifting K+ ions to the surface of the $SiO_2$ layer by BT treatment;

FIG. 1D shows a state B of the Si substrate in which the shifting of K+ ions has been completed, the application of heat has been stopped, and the electrodes have been removed, and thereby an electret layer according to the present invention has been provided; and FIG. 1E shows a state C of the Si substrate in which a protective hydrophobic layer has further been formed upon the surface of the electret layer ($SiO_2$) in which the shifting of K+ ions has been completed;

FIG. 7 is a schematic figure for explanation of the forming method of the electret upon the comb-tooth portions of the movable comb-tooth electrode using BT treatment, according to the method of manufacture of the three-dimensionally shaped comb-tooth electret electrode of the present invention;

FIG. 8 is a figure showing a situation in which, from the state shown in FIG. 7, the biasing voltage VB is increased to a pulling in voltage, so that the movable comb-tooth electrode 21 goes into a pulled-in state;

FIG. 9 (9A-9D) is a schematic figure showing a phenomenon with which, by alternately applying, as the biasing voltage VB, the pulling in voltage and a pulled-in state release voltage that is applied for releasing the pulled-in state and that is lower than the pulling in voltage, the comb-tooth portion 23 of the movable comb-tooth electrode 21 is alternatingly pulled against two opposed comb-tooth portions 24 of a fixed comb-tooth electrode;

FIG. 11 is a figure showing the benefits when this ABT treatment is performed in an atmosphere of hydrogen.

DESCRIPTION OF THE PREFERRED EMBODIMENTS

In the following, embodiments of the present invention will be explained with reference to FIGS. 1 through 11. In order to explain the theory of the method of manufacture of the three-dimensionally shaped comb-tooth electret electrode according to the present invention, the fundamental manufacturing process will be explained in a simple manner, and moreover each of the manufacturing processes will also be further explained in detail. Next, a method for improving the performance of the electret electrode will be explained. Then, the method of manufacturing the three-dimensionally shaped comb-tooth electret electrode according to the present invention will be explained on the basis of the fundamental method of manufacture thereof, and finally, the advantageous effects of this method of manufacturing this three-dimensionally shaped comb-tooth electret electrode will be explained.

Theory of the Construction and the Method for Manufacture of the Electret Electrode FIGS. 1(a) through 1(e) show manufacturing steps for explanation of the theory of the method of manufacture of an electret electrode according to the method of the present invention.

Figure 1:
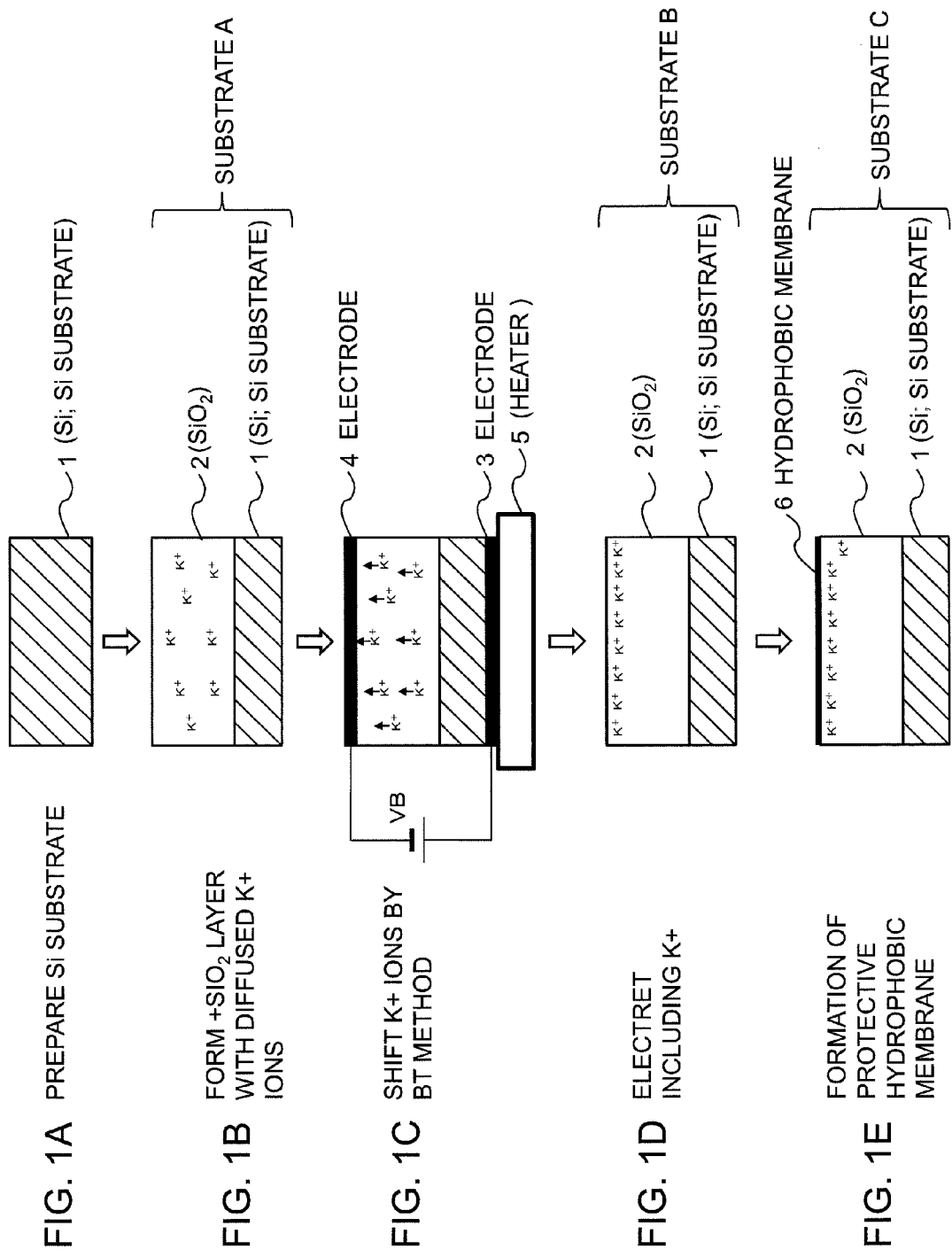
FIG. 1 is a figure showing the theory of the method of manufacturing a three-dimensionally shaped comb-tooth electret electrode according to the present invention.

First, an Si substrate 1 (i.e. a wafer) is prepared (FIG. 1A), and an $SiO_2$ layer 2 that includes K+ ions is formed upon the surface of this Si substrate 1 by wet oxidization, as will be described hereinafter (FIG. 1B). The substrate in this state will be termed the "substrate A". It should be understood that, in FIG. 1, the thickness of the $SiO_2$ layer is exaggerated. Furthermore, while actually a large number of electret electrodes are manufactured at the same time upon the wafer, for explanation, this is shown as simplified in the figures.

Next, in the state of FIG. 1B, the substrate A is sandwiched between electrodes 3 and 4 above and below it, and a biasing voltage VB is applied while applying heat with a heater 5 (refer to FIG. 1C). This process is termed "BT treatment" (Bias-Temperature treatment), and is a method of shifting the ions within the substrate by applying a voltage while the substrate is kept in a high temperature state in which the ions can shift easily.

When the K+ ions have shifted sufficiently within the $SiO_2$ surface layer, the application of heat is stopped, and the application of biasing voltage is stopped after the temperature of the substrate has dropped to around room temperature. Subsequently, the electrodes 3 and 4 are removed (refer to FIG. 1D). The substrate in this state will be termed the "substrate B".

In the above manner, an electret substrate B is formed having an $SiO_2$ electret layer that includes K+ ions.

Formation of a Protective Layer Over the Electret Electrode

The $SiO_2$ layer into which K+ ions have been injected is formed upon the electret substrate B as explained in the above description, but, if this comb-tooth electrode were to be exposed to air over a long time period, the K+ ions would react with the moisture in the air and would be gradually neutralized, so that its function as an electret would deteriorate.

In order to prevent this type of neutralization of the K+ ions, a hydrophobic membrane 6 is further formed upon the surface of the $SiO_2$ layer (refer to FIG. 1E). The substrate in this state will be termed the "substrate C".

Fundamentally, the three-dimensionally shaped comb-tooth electret electrode is manufactured by using the method of manufacture explained in the above description. For forming a three-dimensional structure from the Si substrate (refer to FIG. 6), a step is provided between the step FIG. 1A and the step 1(b), in which formation of such a structure by etching or the like is performed (for example, refer to Patent Application 2012-036247), but this is not shown here.

As above, the overall manufacturing process thereof has been described in a simple manner, in order to make the theory of the above described method of manufacture of the three-dimensionally shaped comb-tooth electret electrode easier to understand. In the following, for each of the manufacturing steps explained in the above description, the portion that constitutes a defining feature of the present invention will now be explained in detail.

The Method of Forming the $SiO_2$ Layer Including K+ Ions by Wet Oxidization

Figure 2:
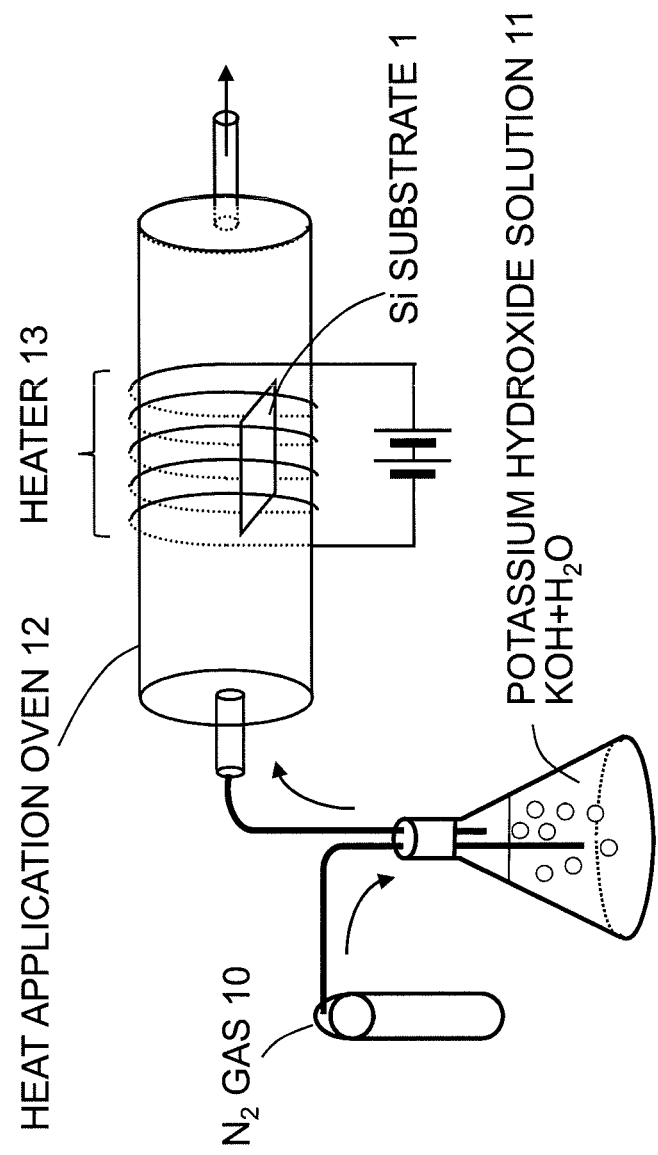
FIG. 2 is a schematic figure showing a wet oxidization method that is used in the manufacture of the $SiO_2$ layer including K+ ions of FIG. 1B.

FIG. 2 shows, in a simple manner, the theory of the method of wet oxidization for forming an $SiO_2$ layer 2 with K+ ions diffused thereinto upon the Si substrate of FIG. 1A, thus manufacturing the substrate A. This method is a method of forming an $SiO_2$ layer containing K+ ions by employing a method of forming an $SiO_2$ layer upon the Si substrate by thermal oxidization.

$N_2$ gas is passed through an aqueous solution 11 of KOH dissolved in pure water, and thereby water vapor including K+ ions is picked up into this $N_2$ gas. This water vapor is conducted into a heat application oven 12, and an $SiO_2$ layer including K+ ions is formed upon the Si substrate 1 that has been loaded into this heat application oven 12. According to this wet oxidization method, as shown in FIG. 1B, the Si substrate A upon which an $SiO_2$ layer including K+ ions has been formed is manufactured.

BT Treatment in a Hydrogen Atmosphere

Figure 3:
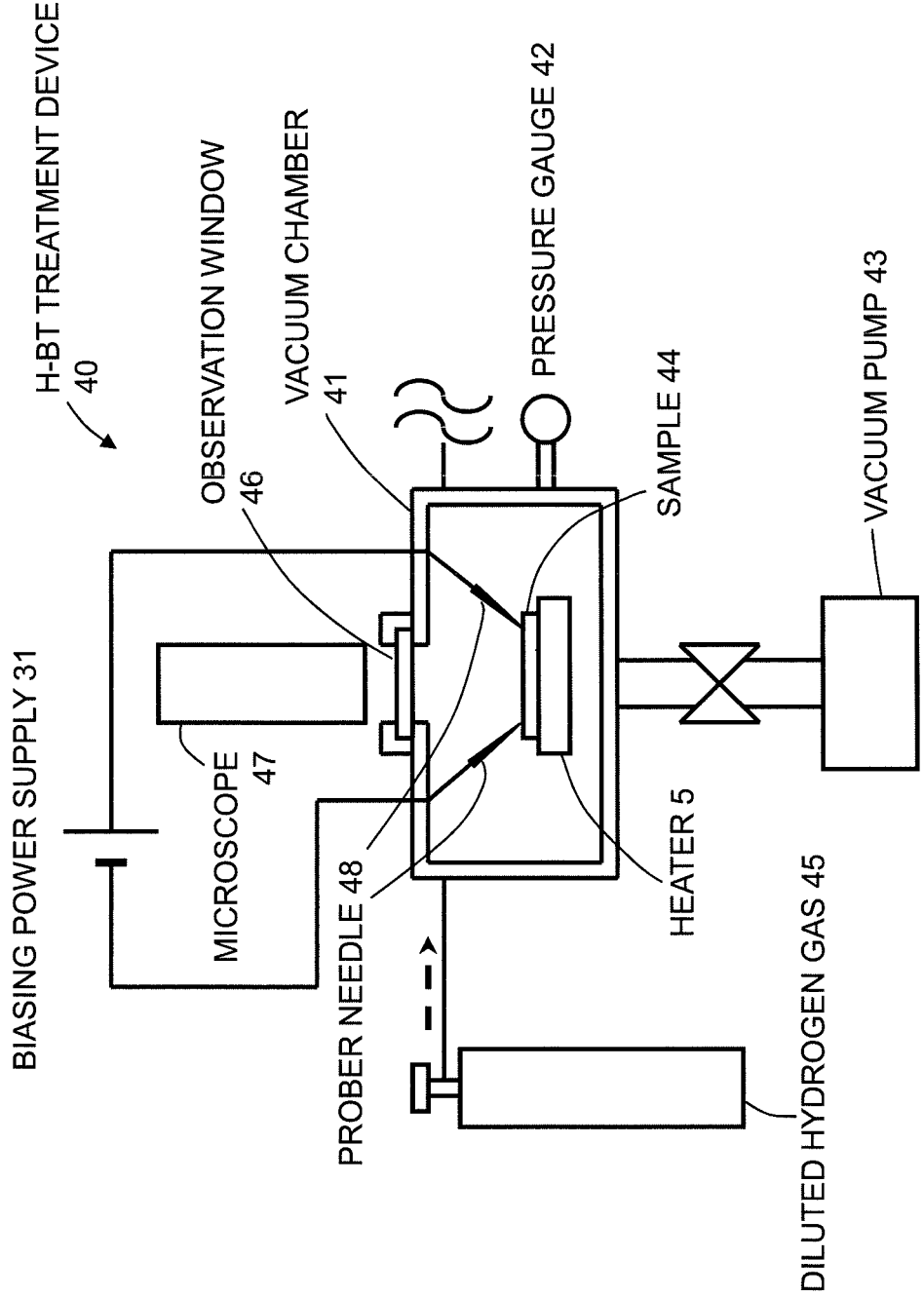
FIG. 3 is a schematic figure showing a device for manufacturing the electret electrodes using BT treatment in an atmosphere of hydrogen.

If the BT treatment explained in FIG. 1C is performed in an atmosphere of hydrogen, then it is possible further to increase the electret voltage that is generated due to shifting of the K+ ions. FIG. 3 is a schematic figure showing a processing device 40 for performing BT treatment in an atmosphere of hydrogen (hereinafter abbreviated as an "H-BT apparatus").

Figure 5:
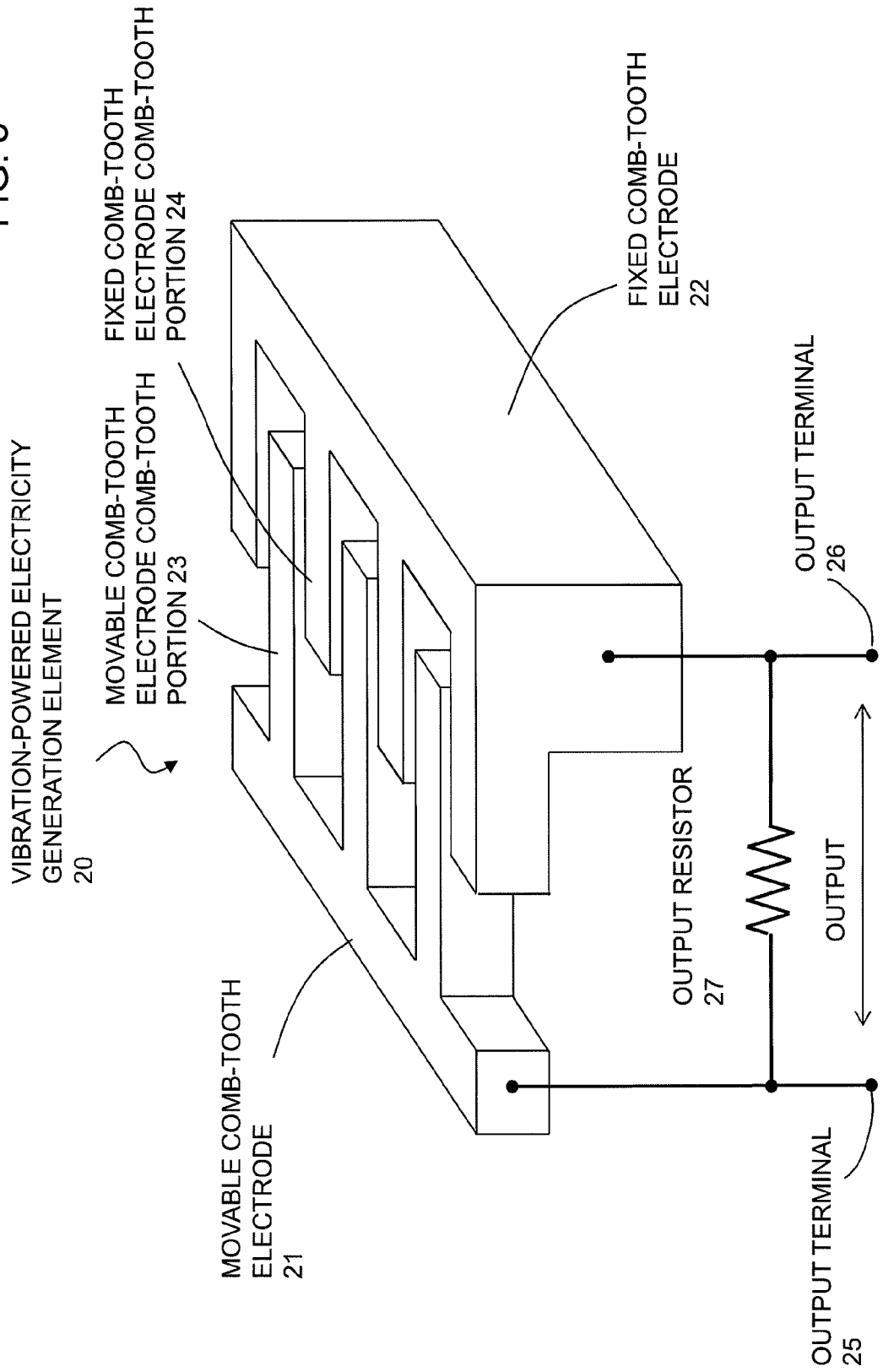
FIG. 5 is a schematic figure showing the overall structure of a vibration-powered electricity generation element 20 including two three-dimensionally shaped comb-tooth electrodes including electrets that are manufactured by employing the method of manufacture of a three-dimensionally shaped comb-tooth electret electrode of the present invention.

This H-BT treatment apparatus is provided with a vacuum chamber 41, and a pressure gauge 42 and a vacuum pump 43 are connected to the vacuum chamber 41. The substrate A (i.e. the wafer) manufactured by the manufacturing step shown in FIG. 1B, or a three-dimensional comb-tooth electrode formed upon the substrate A as shown in FIG. 5, is installed in the vacuum chamber 41 as a sample 44. After the vacuum chamber 41 has been evacuated, diluted hydrogen 45 is introduced into the vacuum chamber 41. In order to perform the BT treatment described above, heat is applied to the sample 44 with the heater 5, and the biasing voltage VB is applied thereto from prober needles 48 of a prober (not shown in the drawings) that is installed within the vacuum chamber 41.

The diluted hydrogen that is used as described above consists of 5% hydrogen and 95% nitrogen; but it would also be acceptable to utilize hydrogen diluted using some inactive gas other than nitrogen, provided that this inactive gas does not react with the substrate A. Accordingly, instead of nitrogen, it would also be acceptable to utilize an inert gas such as argon, xenon, helium, or the like as the diluent gas. It should be understood that the use of diluted hydrogen is in order to eliminate any possibility of the occurrence of a hydrogen explosion due to discharge of electrostatic electricity or the like.

Although this matter will be described in detail hereinafter, if an electret of the type explained in the above description is manufactured on the comb-tooth portion 23 of the three-dimensionally shaped movable comb-tooth electrode 21 shown in FIG. 5, then the biasing voltage VB is applied between a three-dimensional movable comb-tooth electrode 21 and a fixed comb-tooth electrode 22. Due to this, when contacting the prober needles 48 against the movable comb-tooth electrode 21 and the fixed comb-tooth electrode 22, this operation is performed while observing through an observation window 46 with a microscope 47. In order for the prober needles 48 to contact against the movable comb-tooth electrode 21 and the fixed comb-tooth electrode 23, metallic pads (not shown in the figures) are provided for contacting with the movable comb-tooth electrode 21 and the fixed comb-tooth electrode 23. These metallic pads for contacting are formed, using an appropriate metal, during the semiconductor process of manufacturing the movable comb-tooth electrode 21 and the fixed comb-tooth electrode 22 in shapes as shown in FIG. 5 (for example, refer to Japanese Patent Application 2012-036247).

It should be understood that since actually BT treatment or H-BT treatment is performed on the substrate A upon which a large number of the three-dimensional comb-tooth electrode constructions shown in FIG. 5 are formed, it would be possible to arrange to provide these pads for contacting on the exterior of the wafer, and to provide wiring from these pads for contacting that are thus provided on the outside, in order to supply voltage to the large number of comb-tooth electrodes upon the wafer during semiconductor processing.

The Method for Forming a Hydrophobic Layer for Protection of the Electret Electrode A chemically adsorbed monomolecular layer such as described, for example, in Japanese Laid-Open Patent Publication 2008-110436 is used as a hydrophobic layer that is formed in the final step (FIG. 1E) of manufacture of the electret electrode. With this method, it is possible easily and simply to form a chemically adsorbed monomolecular layer upon the $SiO_2$ layer, using, for example, a chemical substance whose principal components are fluorocarbon-, hydrocarbon-, and alkoxysilyl-groups.

Figure 4:
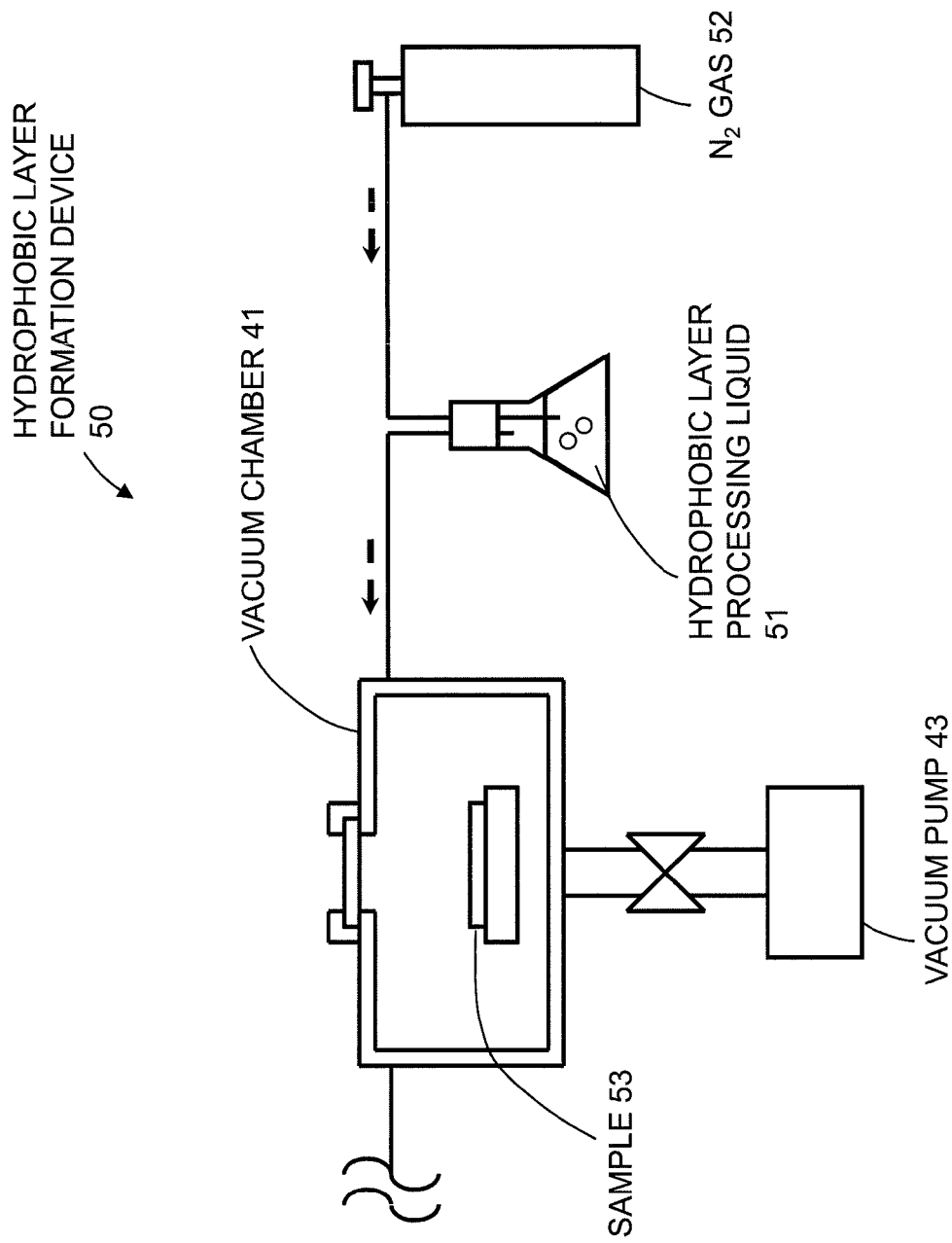
FIG. 4 is a schematic figure showing a device for forming the protective hydrophobic layer upon the electret electrodes in an atmosphere of nitrogen.

FIG. 4 schematically shows an apparatus 50 for forming this hydrophobic layer that consists of a chemically adsorbed monomolecular layer. Since the hydrophobic layer is formed continuously after BT treatment or H-BT treatment without contact with the atmospheric air, accordingly the same chamber as the vacuum chamber of the device for H-BT treatment shown in FIG. 3 may be used as the vacuum chamber of this hydrophobic layer formation device.

In the hydrophobic layer formation device 50 of FIG. 4, the vapor of a hydrophobic layer processing liquid 51 is introduced into the vacuum chamber 41, with a chemical substance for formation of the hydrophobic layer being dissolved therein. By performing bubbling by introducing $N_2$ gas 52 into the hydrophobic layer processing liquid 51, $N_2$ gas containing vapor of the hydrophobic layer processing liquid 51 is introduced into the vacuum chamber 41.

The sample 53 is the substrate B of FIG. 1D, or the substrate B in the state in which a large number of three-dimensionally shaped comb-tooth electrodes have been formed upon it, as explained above. This sample 53 is installed within the chamber 41, and the $N_2$ gas that includes vapor of the hydrophobic layer processing liquid 51 is introduced for forming a chemically adsorbent monomolecular layer. When the $SiO_2$ layer absorbs this vapor, a chemically adsorbed monomolecular layer consisting of the chemical substance described above is formed upon its surface. This chemically adsorbed monomolecular layer is formed by the vapor of the chemical substance described above, and accordingly the vapor can enter simply and easily even between the movable comb-tooth electrode 21 and the fixed comb-tooth electrode 22, so that thereby the chemically adsorbed monomolecular layer is formed over the entire surface of the comb-tooth portion 23 of the movable comb-tooth electrode 21

After the BT treatment or the H-BT treatment, the formation of a hydrophobic layer such as that described above is performed continuously without the substrate coming into contact with the atmospheric air. The hydrophobic layer consisting of the chemically adsorbed monomolecular layer described above prevents the K+ ions that have shifted into the $SiO_2$ surface layer from being neutralized by moisture or the like in the atmospheric air.

It is possible to employ, for example, fluorocarbon-, hydrocarbon-, and alkoxysilyl-groups as the main component of the chemical substance from which the chemically adsorbed monomolecular layer described above is manufactured. As the main component of the chemical substance of this example, $CF_3(CF_2)_n(CH_2)_2Si(OA)_3$, $[CF_3(CF_2)_n(CH_2)]_2Si(OA)_2$, or $[CF_3(CF_2)_n(CH_2)_2]_3SiOA$ (where n is an integer, and A is a short chain alkyl group such as a methyl-, an ethyl-, a propylene-group) may be suggested. In concrete terms, $CF_3CH_2O(CH_2)_{15}Si(OCH_3)_3$, $CF_3(CH_2)_2Si(CH_3)_2(CH_2)_{15}Si(OCH_3)_3$ or the like may be suggested.

With an electret formed as described above and having an $SiO_2$ layer that includes K+ ions, the period over which the electric charge is maintained is extremely long, and accordingly it is possible to manufacture a compact generator having an electrode whose service life is long.

Schematic Structure of a Vibration-Powered Electricity Generation Element Having Three-Dimensionally Shaped Comb-Tooth Electrodes FIG. 5 is a figure showing in simplified form the overall structure of a vibration-powered electricity generation element 20 including two three-dimensionally shaped comb-tooth electrodes defining electrets that are made by the method of manufacture of the present invention. The number of comb-teeth that are manufactured on each of these comb-tooth electrodes may be appropriately increased or decreased, in correspondence to the output specification for the vibration-powered electricity generation element.

This vibration-powered electricity generation element 20 includes a movable three-dimensionally shaped comb-tooth electrode 21 and a fixed three-dimensionally shaped comb-tooth electrode 22. The movable comb-tooth electrode 21 and the fixed comb-tooth electrode 22 have respective pluralities of comb-tooth portions 23 and 24. While detailed explanation is omitted, it should be understood that the movable comb-tooth electrode 21 and the fixed comb-tooth electrode 22 shown in FIG. 5 are manufactured from a single Si substrate or the like by a semiconductor process such as etching (for example, refer to Japanese Patent Application 2012-036247). While a spring portion (shown in a simple manner in FIGS. 7 through 9) that movably supports the movable comb-tooth electrode 21 is omitted in FIGS. 5 and 6, this spring portion also is simultaneously manufactured by a semiconductor process, and thereby the movable comb-tooth electrode 21 vibrates due to vibrations from the exterior.

Furthermore, the movable comb-tooth electrode 21 and the fixed comb-tooth electrode 22 having these shapes are oxidized by a wet oxidization method as shown in FIG. 2, and thereby $SiO_2$ layers including K+ ions are formed upon their comb-tooth surfaces. Moreover, BT treatment as described above is performed, so that the K+ ions on the $SiO_2$ layer are shifted to its surface, and thereby electrets are manufactured.

It should be understood that, for the following explanation, a case is explained in which an electret consisting of K+ ions is manufactured upon the movable comb-tooth electrode using BT treatment. Accordingly, the voltage VB is applied between the movable comb-tooth electrode 21 and the fixed comb-tooth electrode 22, so as to shift the K+ ions in the $SiO_2$ layer of the comb-tooth portion 23 of the movable comb-tooth electrode 21 to its surface. The electret consisting of K+ ions may also be manufactured upon the fixed comb-tooth electrode 22, and in this case the voltage VB is applied between the movable comb-tooth electrode 21 and the fixed comb-tooth electrode 22 with its positive and negative sides reversed, as explained below.

When the three-dimensionally shaped movable electrode 21 upon which the electret layer is formed as explained above vibrates, an output voltage is outputted between its output terminals 25 and 26. It should be understood that, if the output is to be utilized in the form of an electrical current, then, instead of the output resistor 27, a rectification circuit should be connected, and then a capacitor should be used for accumulating the DC current after rectification.

Figure 6:
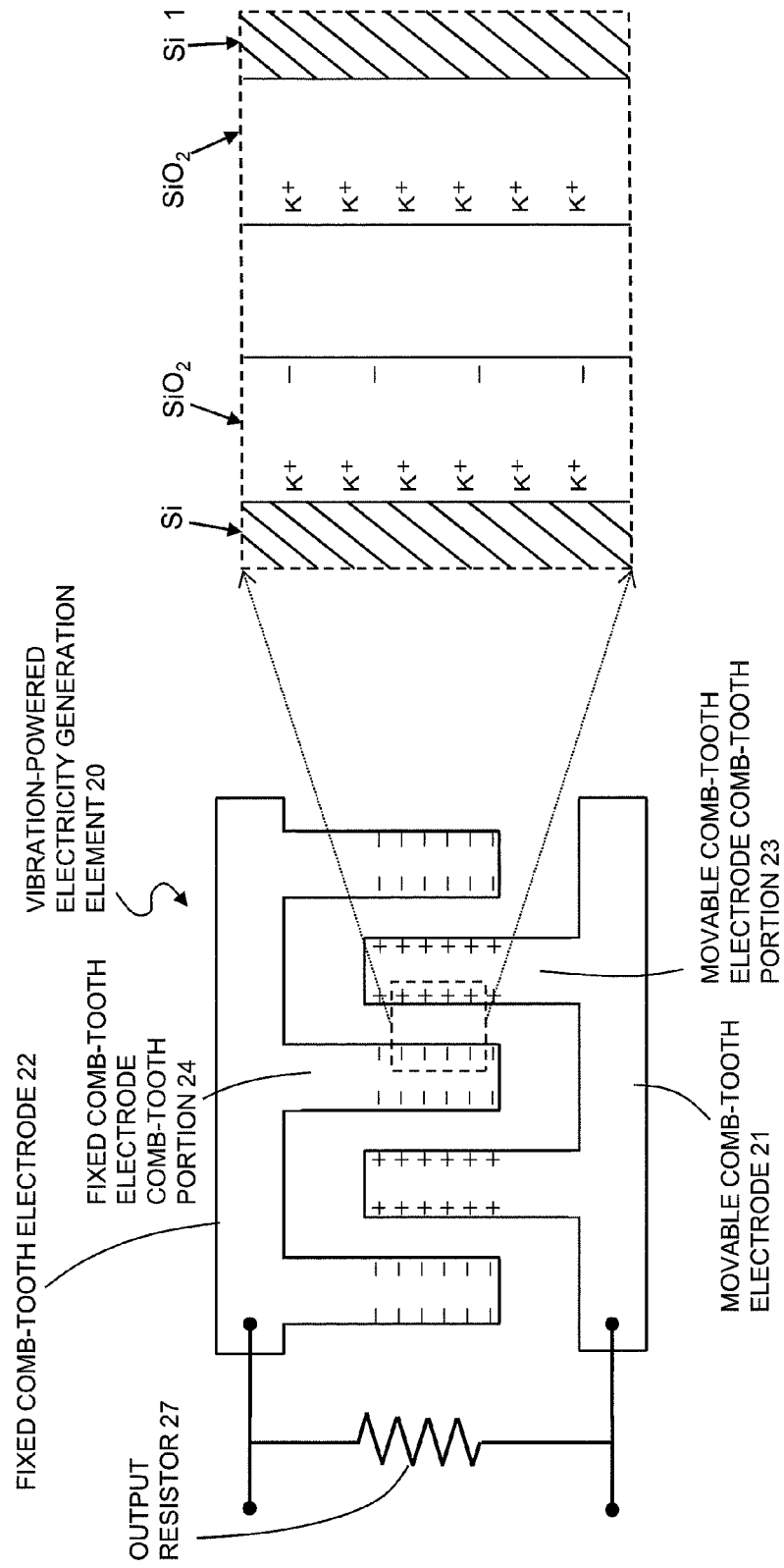
FIG. 6 is a schematic figure showing the structure of an electret formed upon the comb-tooth electrodes of the vibration-powered electricity generation element shown in FIG. 5.

FIG. 6 is a plan view of the vibration-powered electricity generation element 20 of FIG. 5, and is a figure schematically showing the structure of the $SiO_2$ electret layers formed upon the comb-tooth portions 23 of the three-dimensionally shaped movable comb-tooth electrode 21. To the portions of FIGS. 1 and 5 that correspond to one another, the same reference symbols are appended. While the distribution of K+ ions on the comb-tooth portions 23 of the movable comb-tooth electrode 21 and the distribution of K+ ions on the comb-tooth portions 24 of the fixed comb-tooth electrode 22 are different, this is due to the method of manufacture of the electret according to the present invention, as will be explained below. In the comb-tooth portions 23 of the movable comb-tooth electrode 21, the K+ ions are shifted closer to the surface, and these shifted K+ ions function as an electric charge upon the electret.

Method for Forming the Electret Upon the Three-Dimensionally Shaped Comb-Tooth Electrodes FIG. 7 is a figure showing the vibration-powered electricity generation element 20 as seen from above, in a similar manner to FIG. 6. In order to explain the method of manufacture of an electret upon the three-dimensionally shaped comb-tooth electrodes according to the present invention in a simple manner, the movable comb-tooth electrode 21 of the three-dimensionally shaped comb-tooth electrodes is shown as including only one comb-tooth portion 23, and the fixed comb-tooth electrode 22 is shown as including only two comb-tooth portions 24.

As will be understood from the above explanation and FIG. 7, $SiO_2$ layers including K+ ions are formed over the entire surfaces of the movable comb-tooth electrode 21 and the fixed comb-tooth electrode 22. When, while applying heat to the movable comb-tooth electrode 21 and the fixed comb-tooth electrode 22 as shown in FIG. 3, so-called BT treatment is performed by applying voltage between these electrodes, as shown in FIG. 6, the K+ ions in the $SiO_2$ layer of the comb-tooth portion 23 of the movable comb-tooth electrode 21 are shifted towards its surface, while on the other hand the K+ ions in the $SiO_2$ layers of the comb-tooth portions 24 of the fixed comb-tooth electrode 22 are shifted towards their interiors. The K+ ions that have shifted towards the surface of the $SiO_2$ layer on the comb-tooth portion 23 of the movable comb-tooth electrode 21 in this manner function as a charge upon the electret.

The gaps g1 and g2 between the comb-tooth portion 23 of the movable comb-tooth electrode 21 and the comb-tooth portions 24 of the fixed comb-tooth electrode 22 are around a few μm, and their thicknesses in the width direction of the comb-tooth portions 23 and 24 are both around 20 μm. Since the widths of the comb-tooth portions 24 and their gaps change in correspondence to the targeted performance for the electret, in other words in correspondence to its targeted amount of surface charge, accordingly these widths and gaps for the comb-tooth portions 23 and 24 are only examples. Moreover, the thickness of the comb-tooth portions 23 and 24 in the height direction also varies according to the performance for the electret, and is from several tens of μm to several hundreds of μm.

The three-dimensionally shaped comb-tooth electrodes having shapes such as described above are heated with the heater to 400° C. or higher, and moreover a biasing voltage VB of around 200 V is applied between the movable comb-tooth electrode 21 and the fixed comb-tooth electrode 22, with the movable comb-tooth electrode 21 on the positive side. By doing this, the K+ ions are shifted towards the surface of the SiO₂ layer of the comb-tooth portion 23 of the movable comb-tooth electrode 21, so that the three-dimensionally shaped movable comb-tooth electrode acquires the function of an electret.

Formation of the Electret During BT Treatment while Taking Advantage of the Phenomenon of Pulling in of the Movable Comb-Tooth Electrode However, when a biasing voltage of around 100 V is applied to a three-dimensionally shaped comb-tooth electrode of the shape described above, because of the attractive force generated by the electric field between the comb-tooth portion 23 of the movable comb-tooth electrode 21 and the comb-tooth portions 24 of the fixed comb-tooth electrodes 22, a so-called "pulling in" phenomenon occurs, in which the comb-tooth portion 23 of the movable comb-tooth electrode 21 is pulled towards one of the comb-tooth portions 24 of the fixed comb-tooth electrodes 22 and comes into the state of being contacted thereagainst.

In FIG. 8, this state is shown in which the comb-tooth portion 24a on the lower side of the fixed comb-tooth electrode 22 is "pulled-in" against.

It should be understood that whether this pulling in phenomenon actually takes place or not depends upon the attractive electrostatic force between the comb-tooth portion 23 of the movable comb-tooth electrode 21 and the comb-tooth portions 24 of the fixed comb-tooth electrodes 22, this force being determined by the shapes of the three-dimensionally shaped comb-tooth electrodes, the biasing voltage VB, and the gaps between them, and by the spring force of the spring portion 30. With the method of manufacture of the three-dimensionally shaped comb-tooth electret electrode according to the present invention, the setting of the biasing voltage VB and the construction of the three-dimensionally shaped comb-tooth electrodes (including the construction of the spring 30) are designed so that this pulling in phenomenon takes place, and thereby this pulling in phenomenon is positively utilized.

With this pulling in phenomenon, it is considered that the one of the upper and lower comb-tooth portions 24 of the fixed comb-tooth electrode 22 in FIG. 7 towards which the comb-tooth portion 23 of the movable comb-tooth electrode 21 will initially be pulled will be different, depending upon any small difference between the gaps g1 and g2, and upon slight differences in the states of charge of the surfaces of the comb-tooth portions 23 and 24. When the biasing voltage VB is somewhat lowered in the pulled-in state shown in FIG. 8, then the pulled-in state is cancelled due to the spring force of the spring portion 30, and the system returns to the state shown in FIG. 7. The biasing voltage at which transition to this pulled-in state takes place will be termed the "pulling in voltage", and the voltage at which the pulled-in state is released will be termed the "pulled-in state release voltage".

After the pulled-in state has been established as shown in FIG. 8, the pulling in is released by lowering the biasing voltage VB to below the pulled-in state release voltage, and then again the biasing voltage VB is increased. Then the system goes into the pulled-in state towards the other comb-tooth portion of the fixed comb-tooth electrode 22, i.e. the comb-tooth portion other than the comb-tooth portion 24a that is in the contacting state in the pulled-in state described above; in other words, the movable comb-tooth portion 23 is pulled towards the comb-tooth portion 24b on the upper side, so that the pulled-in state is again established in the opposite sense. It is considered that this is because when, in the previous pulling-in episode, the movable comb-tooth portion 23 was contacted against the comb-tooth portion 24a of the fixed comb-tooth electrode 23 on its lower side, the polarized electrical charge generated on the surface of the comb-tooth portion of the movable comb-tooth electrode 21 neutralized the polarized electric charge on the surface of that comb-tooth portion 24a of the fixed comb-tooth electrode 22, so that the charge on the contacting surface of the comb-tooth portion 23 of the movable comb-tooth electrode 21 was reduced. It is considered that the pulling in phenomenon in which the comb-tooth portion 23 of the movable comb-tooth electrode 21 is alternatingly pulled to and fro in this manner between the comb-tooth portions 24a and 24b of the fixed comb-tooth electrode 22 is generated because the distances g1 and g2 between the comb-tooth portion 23 of the movable comb-tooth electrode 21 and the comb-tooth portions 24a and 24b of the fixed comb-tooth electrode 22 are almost the same (i.e. g1~g2) in the state in which VB is not being applied, and because the attractive force changes in this way due to change of the charges on the surfaces of the comb-tooth portions 23 and 24 of the movable comb-tooth electrode 21 and the fixed comb-tooth electrode 22.

When the application of the biasing voltage that brings about the pulled-in state and the reduction of the biasing voltage that releases the pulled-in state are repeated in this manner, the operation of the comb-tooth portion 23 of the movable comb-tooth electrode 21 being pulled in alternatingly against the two mutually opposed comb-tooth portions 24a and 24b of the fixed comb-tooth electrode 22 is repeated.

This situation is shown in FIG. 9. Suppose that the first pulling in voltage is VBP1, and the first pulled-in state release voltage is VBR1. Naturally, VBP1>VBR1. After this, the biasing voltage that is applied is changed through VBP2→VBR2→VBP3→VBR3 . . . . As the operations of pulling in and pulled-in state release are repeated, the pulling in voltage and the pulled-in state release voltage progressively increase gradually (refer to FIG. 10). Accordingly, biasing voltages such that VBP1≤VBP2≤VBP3 . . . and VBP1>VBR1, VBP2>VBR2, VBP3>VBR3 . . . are applied between the movable comb-tooth electrode 21 and the fixed comb-tooth electrode 22.

Figure 10:
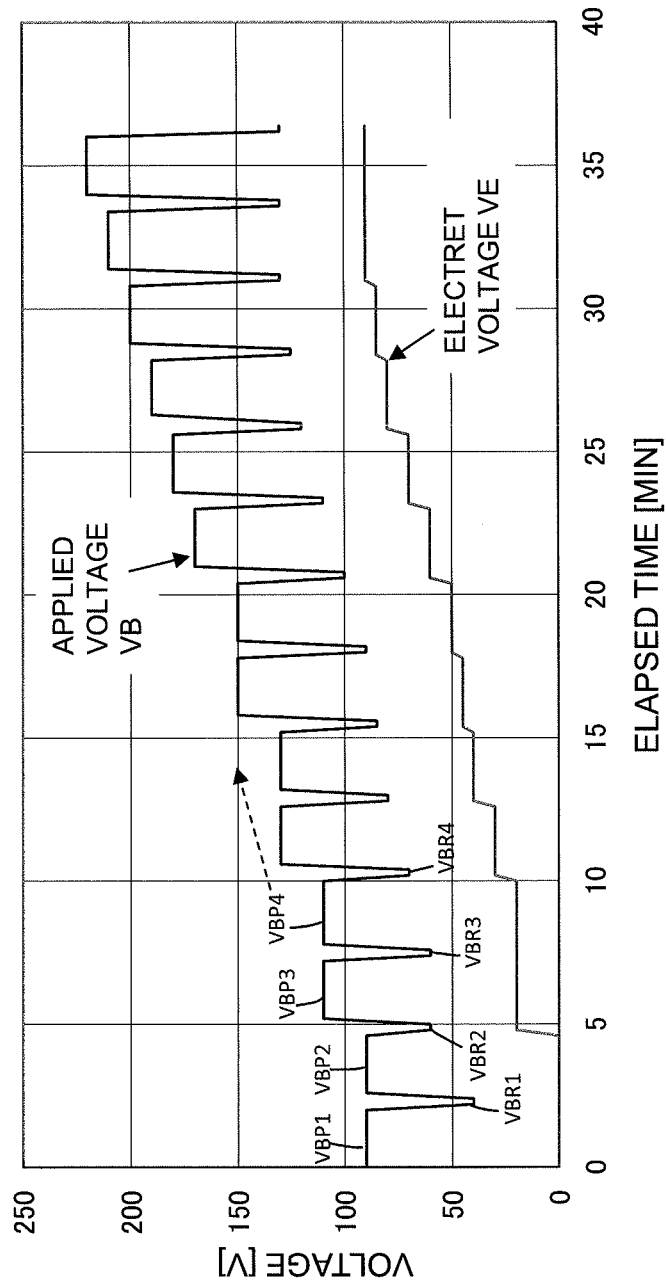
FIG. 10 is a figure showing the electret voltage that is generated upon the comb-tooth portions 23 of the movable comb-tooth electrode 21, when a pulling in voltage and a pulled-in state release voltage are alternatingly applied, according to an ABT treatment method.

Actually, as shown in FIG. 10, the biasing voltage is increased until the pulled-in state is established, and this voltage is maintained for a number of minutes during the pulled-in state, so that the pulled-in state is maintained. Next, the biasing voltage is decreased until this pulled-in state is released. This kind of increase and decrease of the biasing voltage is repeated. It should be understood that, with the three-dimensionally shaped comb-tooth electrode that is manufactured as described here, it will be sufficient for the pulling in voltage VBP2 the second time to be around +30 V higher than the pulling in voltage the first time, and, in a similar manner, it will be sufficient for each of the subsequent pulling in voltages to be around +30 V higher than the pulling in voltage the time before.

Moreover, although this is not shown in FIG. 10, while the pulling in voltage and the pulled-in state release voltage are increased each time the application of biasing voltage is repeated in the manner described above, gradually they approach a constant value. Accordingly, the upper limit value for the pulling in voltage is set less than or equal to the constant value as above, or is set less than or equal to a voltage that generates electrical discharge between the movable comb-tooth electrode 21 and the fixed comb-tooth electrode 22.

It should be understood that the time period over which the pulled-in state described above is maintained depends upon the thicknesses of the $SiO_2$ layers including K+ ions that are formed on the three-dimensionally shaped comb-tooth electrodes, and upon the temperature of the heating and upon the biasing voltage VB that are applied to those $SiO_2$ layers. If these three-dimensionally shaped comb-tooth electrodes are manufactured by processing by the BT method under conditions such as described above, then the K+ ions will be sufficiently shifted by maintaining the pulled-in state for several minutes, as explained in FIG. 10.

If the biasing voltage VB is applied while being increased and decreased, as described above and explained with reference to FIGS. 9 and 10, then the electret voltage of the comb-tooth portion 23 of the movable comb-tooth electrode 21 gradually increases, in other words its surface electrical potential gradually increases. The way in which this electret voltage VE increases is also shown in FIG. 10. It should be understood that, in the following, this BT treatment in which the application of pulling in voltage and the application of pulled-in state release voltage are performed alternatingly in this manner will be abbreviated as "ABT treatment" (Alternating Bias-Temperature treatment).

In the prior art, it was thought that, at the time point that the pulled-in state was once established, it was not possible further to shift the K+ ions in the $SiO_2$ layers, so that the electret voltage of a three-dimensionally shaped comb-tooth electrode such as that described above could not be further increased. However, it will be understood that, by repeating the steps of pulling-in and pulled-in state release as shown in FIG. 10, it is possible to manufacture a three-dimensionally shaped comb-tooth electrode equipped with an electret that has a high electret voltage.

The Benefits when ABT Treatment is Performed in an Atmosphere of Hydrogen

FIG. 11 is an example showing the benefits when the above ABT treatment is performed in an atmosphere of hydrogen.

If there is no hydrogen atmosphere, in other words in a situation in which the vacuum chamber is simply evacuated with the vacuum pump 43, for example to 2 kPa, and if the final biasing voltage VB (=the pulling in voltage) is made to be 200 V, then the electret voltage VE becomes 95 V.

By contrast, if diluted hydrogen is introduced into the vacuum chamber and the pressure within the vacuum chamber is brought to around 6 kPa, then, with the same final biasing voltage VB=200 V, the electret voltage becomes 200 V.

While the application of the biasing voltage is performed in a similar manner to that of the case shown in FIG. 8, as compared to the case shown in FIG. 10, the increase in the voltage of the electret is around twice as great. It should be understood that the data shown in FIG. 10 relates to a case in which the ABT treatment was performed in atmospheric air It is considered that the reason that the electret voltage that was obtained in the case in which the ABT treatment was performed in a hydrogen atmosphere was higher as compared to the case of processing in the atmospheric air, was because the hydrogen terminated the large number of dangling bonds that were present in the vicinity of the $SiO_2$ surface. This is because, if a hydrogen atmosphere is not used, then the K+ ions that are shifted to the vicinity of the surface of the $SiO_2$ due to the ABT treatment couple with these dangling bonds, so that there is a possibility that the effective electric charge due to the K+ ions may be decreased.

It should be understood that this beneficial effects due to processing in a hydrogen atmosphere for obtaining a high electret voltage are not limited to ABT treatment; they are also obtained in a similar manner in the case of normal bT treatment. Accordingly, as will be understood by reference to FIG. 1 and to the above explanation, this beneficial effect can also be obtained in the case of manufacture of a planar electret using H-BT treatment.

After the ABT treatment has been performed in a hydrogen atmosphere as described above, the hydrophobic layer explained with reference to FIG. 4 is formed in order to protect the electric charges on the electret.

As has been explained above, the method for manufacturing a three-dimensionally shaped comb-tooth electret electrode provided with an electret in which ions having positive electric charge are held is a method for manufacturing a three-dimensionally shaped comb-tooth electrode that is made from Si and that is provided with an electret in which ions having positive electric charge are held, and includes the following steps: a first step of forming a three-dimensionally shaped movable comb-tooth electrode and a three-dimensionally shaped fixed comb-tooth electrode that are made from an Si substrate by a semiconductor process; a second step of, in a state in which heat is being applied to this three-dimensionally shaped movable comb-tooth electrode and to this three-dimensionally shaped fixed comb-tooth electrode, contacting a vapor including the above described ions thereto, and forming an oxide layer including the above described ions upon the surfaces of the three-dimensionally shaped movable comb-tooth electrode and the three-dimensionally shaped fixed comb-tooth electrode; and a third step of, along with applying a voltage between these two electrodes so as to make the three-dimensionally shaped movable comb-tooth electrode and the three-dimensionally shaped fixed comb-tooth electrode be either the positive side and the negative side respectively or the negative side and the positive side respectively, also applying heat to the three-dimensionally shaped movable comb-tooth electrode and to the three-dimensionally shaped fixed comb-tooth electrode, and causing the ions included in the oxide layer on the three-dimensionally shaped movable comb-tooth electrode or the three-dimensionally shaped fixed comb-tooth electrode to shift to the surface of that oxide layer;

And this third step includes: a voltage elevation step of raising the voltage between the three-dimensionally shaped movable comb-tooth electrode and the three-dimensionally shaped fixed comb-tooth electrode up to a pulling in voltage at which the three-dimensionally shaped movable comb-tooth electrode is pulled against the three-dimensionally shaped fixed comb-tooth electrode; a voltage maintenance step of maintaining the pulling in voltage for a predetermined time interval; and a voltage reduction step of reducing this voltage to a pulled-in state release voltage at which the three-dimensionally shaped movable comb-tooth electrode, that was pulled against the three-dimensionally shaped fixed comb-tooth electrode, is pulled away therefrom. By performing repeatedly these steps of voltage elevation, voltage maintenance, and voltage reduction while the values of the pulling in voltage and of the pulled-in state release voltage are changed so as to be gradually increased, the operation of each of the comb-teeth of the three-dimensionally shaped comb-tooth electrode being alternatingly pulled in against two opposed comb-teeth of the three-dimensionally shaped fixed comb-tooth electrode is repeated.

According to the method of manufacture of the three-dimensionally shaped comb-tooth electret electrode explained above, it is possible to manufacture a three-dimensionally shaped comb-tooth electrode that is compact and whose surface electric charge density is high, and moreover that can hold electric charge for a long period of time; in other words, it is possible to manufacture an electret whose service life is long.

As has been described above, the numbers of comb teeth of these three-dimensionally shaped comb-tooth electrodes are determined in an appropriate manner, so as to correspond to the various electrical characteristics (such as voltage and current) that are required for this vibration-powered electricity generation element. Moreover, naturally, the size of each of the comb teeth (i.e. its length and its height) can also be designed in an appropriate manner, so as to correspond to the required electrical characteristics.

It should be understood that while, in the embodiment described above, an example was explained in which K+ ions were used as the ions for forming the electret layers, it is still possible to employ the method of manufacture of the three-dimensionally shaped comb-tooth electret electrode of the present invention, even if the positive ions that are used are not K+ ions. Moreover, among positive ions, when alkali ions that have high ionic radius are employed, then the amount of ion shifting after manufacture of the electret is low, and accordingly it is possible to maintain the surface electrical potential over a long period of time, so that the electret layer has a long life. In this case, in the wet oxidization process explained in the above description, instead of an aqueous solution of potassium hydroxide, an aqueous solution containing some positive ions or alkali ions other than K+ ions would be used.

Furthermore, while in the above description an example was explained in which the three-dimensionally shaped comb-tooth electret electrodes were manufactured from a single Si substrate, it would also be acceptable to manufacture them from a plurality of substrates. For example, if the state like that of the substrate A shown in FIG. 1B is established by adhering an $SiO_2$ substrate containing positive ions, or a substrate having an $SiO_2$ layer containing positive ions, to some other substrate, then it would still be possible to perform the subsequent manufacturing processes.

As explained above, using the method for manufacturing a three-dimensionally shaped comb-tooth electret electrode according to the present invention, it is possible to manufacture a three-dimensionally shaped comb-tooth electret electrode having a high electret voltage, and it is possible to manufacture a compact and high output vibration-powered electrical generator by using such three-dimensionally shaped comb-tooth electret electrodes.

The three-dimensionally shaped comb-tooth electrode that has been manufactured by the method of manufacture of a three-dimensionally shaped comb-tooth electret electrode of the present invention can also be applied to devices of various types as a vibration-powered electrical power generation element. For example, it can be applied as an electricity generation element for a transducer such as a microphone or a compact speaker or the like, or as an electricity generation element for a watch or the like.

The above explanation only relates to exemplary embodiments of the present invention, and the present invention is not to be considered as being limited to these embodiments or examples. For a person skilled in the art, it would be possible to implement various changes without departing from the gist of the present invention. In particular, BT treatment in a hydrogen atmosphere can be applied, not only to manufacture of a three-dimensionally shaped comb-tooth electrode as explained in the above description, but also to the manufacture of a planar electret electrode.

What is claimed is:

1. A method for manufacturing a three-dimensionally shaped comb-tooth electret electrode, provided with an electret in which ions having positive electric charge are held, comprising:

a first step of forming a three-dimensionally shaped movable comb-tooth electrode and a three-dimensionally shaped fixed comb-tooth electrode that are made from an Si substrate by a semiconductor process;

a second step of, in a state in which heat is being applied to the three-dimensionally shaped movable comb-tooth electrode and to the three-dimensionally shaped fixed comb-tooth electrode, contacting a vapor including the ions thereto, and forming an oxide layer including the ions upon surfaces of the three-dimensionally shaped movable comb-tooth electrode and of the three-dimensionally shaped fixed comb-tooth electrode; and a third step of, along with applying a voltage between the three-dimensionally shaped movable comb-tooth electrode and the three-dimensionally shaped fixed comb-tooth electrode so as to make these electrodes be either a positive side and a negative side respectively or a negative side and a positive side respectively, also applying heat to the three-dimensionally shaped movable comb-tooth electrode and to the three-dimensionally shaped fixed comb-tooth electrode, and causing the ions included in the oxide layer on the three-dimensionally shaped movable comb-tooth electrode or the three-dimensionally shaped fixed comb-tooth electrode to shift to a surface of the oxide layer;

wherein the third step includes:

a voltage elevation step of raising the voltage between the three-dimensionally shaped movable comb-tooth electrode and the three-dimensionally shaped fixed comb-tooth electrode up to a pulling in voltage at which the three-dimensionally shaped movable comb-tooth electrode is pulled against the three-dimensionally shaped fixed comb-tooth electrode;

a voltage maintenance step of maintaining the pulling in voltage for a predetermined time interval; and a voltage reduction step of reducing the voltage to a pulled-in state release voltage at which the three-dimensionally shaped movable comb-tooth electrode, that was pulled against the three-dimensionally shaped fixed comb-tooth electrode, is pulled away therefrom;

and the voltage elevation step, the voltage maintenance step, and the voltage reduction step are repeatedly performed while the values of the pulling in voltage and of the pulled-in state release voltage are changed so as to be gradually increased, so that the operation of each of the comb-teeth of the three-dimensionally shaped comb-tooth electrode being alternatingly pulled in against two opposed comb-teeth of the three-dimensionally shaped fixed comb-tooth electrode is repeated.

2. A method for manufacturing a three-dimensionally shaped comb-tooth electret electrode according to claim 1, wherein the third step is performed in a hydrogen atmosphere.

3. A method for manufacturing a three-dimensionally shaped comb-tooth electret electrode according to claim 1, further comprising a fourth step, performed after the third step, in which a hydrophobic membrane is formed on the surface of the oxide layer by, in an atmosphere of nitrogen, contacting water vapor including a chemical substance for forming a hydrophobic chemically adsorbed monomolecular layer against the surface of the oxide layer; and wherein the third step and the fourth step are performed continuously within one common vessel.

4. A method for manufacturing a three-dimensionally shaped comb-tooth electret electrode according to claim 1, wherein the ions are alkali ions.

5. A method for manufacturing a three-dimensionally shaped comb-tooth electret electrode according to claim 4, wherein the ions are K+ ions.

* * * * *